United States Patent
Frey et al.

(10) Patent No.: US 8,764,996 B2
(45) Date of Patent: Jul. 1, 2014

(54) METHODS OF PATTERNING A MATERIAL ON POLYMERIC SUBSTRATES

(75) Inventors: Matthew H. Frey, Cottage Grove, MN (US); Khanh P. Nguyen, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1836 days.

(21) Appl. No.: 11/550,542

(22) Filed: Oct. 18, 2006

(65) Prior Publication Data
US 2008/0095985 A1   Apr. 24, 2008

(51) Int. Cl.
| | | |
|---|---|---|
| *C23F 1/02* | (2006.01) |
| *H05K 3/06* | (2006.01) |
| *H05K 3/00* | (2006.01) |
| *H05B 3/84* | (2006.01) |
| *H05K 9/00* | (2006.01) |
| *H05K 1/03* | (2006.01) |

(52) U.S. Cl.
CPC .............. *H05K 3/061* (2013.01); *H05K 3/0079* (2013.01); *H05B 3/84* (2013.01); *H05B 2203/017* (2013.01); *H05K 1/0393* (2013.01); *H05K 3/0014* (2013.01); *H05K 9/0096* (2013.01); *H05K 2201/09036* (2013.01); *H05K 2201/09045* (2013.01); *H05K 2203/0108* (2013.01); *H05K 2203/0528* (2013.01); *H05K 2203/0537* (2013.01); *H05K 2203/1545* (2013.01)
USPC ................... 216/13; 216/17; 216/41; 216/44; 216/49; 216/51; 216/53; 216/54; 216/83; 216/100; 216/101; 216/105; 216/108

(58) Field of Classification Search
None
See application file for complete search history.

(56) References Cited

U.S. PATENT DOCUMENTS

| | | | |
|---|---|---|---|
| 2,963,748 | A | 12/1960 | Young |
| 3,075,280 | A | 1/1963 | Jack et al. |
| 3,620,933 | A | 11/1971 | Grunwald et al. |
| 3,800,020 | A | 3/1974 | Parfet |
| 3,891,514 | A | 6/1975 | Klemm |

(Continued)

FOREIGN PATENT DOCUMENTS

| | | |
|---|---|---|
| DE | 3832299 | 3/1990 |
| EP | 0817549 | 1/1998 |

(Continued)

OTHER PUBLICATIONS

Geissler, M., et al., "Direct Patterning of NiB on Glass Substrates Using Microcontact Printing and Electroless Deposition", *Langmuir*, vol. 19, pp. 6283-6296 (2003), published on web Jun. 27, 2003.

(Continued)

*Primary Examiner* — Anita Alanko
(74) *Attorney, Agent, or Firm* — Gregory D. Allen; Adrian L. Pishko

(57) ABSTRACT

A method of patterning a first material on a polymeric substrate is described. The method includes providing a polymeric film substrate having a major surface with a relief pattern including a recessed region and an adjacent raised region, depositing a first material onto the major surface of the polymeric film substrate to form a coated polymeric film substrate, forming a layer of a functionalizing material selectively on the raised region of the coated polymeric film substrate to form a functionalized raised region and an unfunctionalized recessed region, and etching the first material from the polymeric substrate selectively from the unfunctionalized recessed region.

11 Claims, 2 Drawing Sheets

(56) References Cited

U.S. PATENT DOCUMENTS

| | | | |
|---|---|---|---|
| 3,952,152 A | 4/1976 | Lill et al. | |
| 4,179,797 A | 12/1979 | Johnson | |
| 4,321,296 A | 3/1982 | Rougier | |
| 4,381,421 A | 4/1983 | Coats et al. | |
| 4,412,255 A | 10/1983 | Kuhlman et al. | |
| 4,510,347 A | 4/1985 | Wiech, Jr. | |
| 4,552,615 A | 11/1985 | Amendola et al. | |
| 4,576,850 A | 3/1986 | Martens | |
| 4,614,837 A | 9/1986 | Kane et al. | |
| 4,748,130 A | 5/1988 | Wenham et al. | |
| 4,775,611 A | 10/1988 | Sullivan | |
| 4,869,930 A | 9/1989 | Clarke et al. | |
| 4,915,780 A * | 4/1990 | Beckett | 216/42 |
| 5,061,438 A | 10/1991 | Lillie et al. | |
| 5,094,811 A | 3/1992 | Kane et al. | |
| 5,399,879 A | 3/1995 | Liu | |
| 5,462,624 A | 10/1995 | Kwon | |
| 5,512,131 A | 4/1996 | Kumar et al. | |
| 5,595,943 A | 1/1997 | Itabashi et al. | |
| 5,900,160 A | 5/1999 | Whitesides et al. | |
| 5,932,150 A | 8/1999 | Lacey | |
| 6,048,623 A * | 4/2000 | Everhart et al. | 428/464 |
| 6,121,150 A | 9/2000 | Avanzino et al. | |
| 6,180,239 B1 | 1/2001 | Whitesides et al. | |
| 6,433,481 B1 | 8/2002 | Marutsuka | |
| 6,518,168 B1 * | 2/2003 | Clem et al. | 438/623 |
| 6,582,767 B1 | 6/2003 | Fukushima et al. | |
| 6,599,824 B1 | 7/2003 | Krivokapic | |
| 6,737,170 B2 | 5/2004 | Fitch et al. | |
| 6,776,094 B1 | 8/2004 | Whitesides et al. | |
| 6,788,463 B2 | 9/2004 | Merrill et al. | |
| 6,875,475 B2 | 4/2005 | Moran et al. | |
| 6,911,385 B1 | 6/2005 | Haubrich et al. | |
| 7,041,232 B2 * | 5/2006 | Bietsch et al. | 252/79.1 |
| 7,144,608 B2 | 12/2006 | Paukshto et al. | |
| 7,160,583 B2 | 1/2007 | Nguyen et al. | |
| 7,244,669 B2 | 7/2007 | Sirringhaus et al. | |
| 7,582,509 B2 * | 9/2009 | Li et al. | 438/99 |
| 7,585,424 B2 * | 9/2009 | Mei | 216/41 |
| 2003/0162316 A1 | 8/2003 | Zangmeister et al. | |
| 2004/0075155 A1 | 4/2004 | Huang | |
| 2004/0213954 A1 | 10/2004 | Bourdelais et al. | |
| 2005/0186405 A1 * | 8/2005 | Jeong et al. | 428/209 |
| 2006/0003568 A1 | 1/2006 | Choi et al. | |
| 2006/0121271 A1 * | 6/2006 | Frey et al. | 428/333 |
| 2007/0036951 A1 * | 2/2007 | Nguyen et al. | 428/209 |
| 2007/0049130 A1 | 3/2007 | Kojima et al. | |
| 2007/0095469 A1 * | 5/2007 | Burdinski | 156/277 |
| 2008/0095988 A1 * | 4/2008 | Frey et al. | 428/173 |
| 2008/0150148 A1 * | 6/2008 | Frey et al. | 257/769 |
| 2008/0182079 A1 * | 7/2008 | Mirkin et al. | 428/195.1 |
| 2010/0015535 A1 * | 1/2010 | Song et al. | 430/5 |

FOREIGN PATENT DOCUMENTS

| | | |
|---|---|---|
| EP | 1109434 | 6/2001 |
| GB | 2247784 | 3/1992 |
| GB | 2381274 | 4/2003 |
| JP | 63-285995 | 11/1988 |
| JP | 10-075038 | 3/1998 |
| JP | 2001-177292 | 6/2001 |
| JP | 2001-335952 | 12/2001 |
| JP | 2006-060171 | 3/2002 |
| JP | 2004-146536 | 5/2004 |
| JP | 2004-241761 | 8/2004 |
| JP | 2005-032894 | 2/2005 |
| JP | 2006-261322 | 9/2006 |
| JP | 04-076985 | 2/2008 |
| JP | 2000-174486 | 6/2012 |
| WO | WO 97/34025 | 9/1997 |
| WO | WO 00/79023 | 12/2000 |
| WO | WO 03/049176 | 6/2003 |
| WO | WO 2004/055919 | 7/2004 |
| WO | WO 2004/055920 | 7/2004 |
| WO | WO 2006/061741 | 6/2006 |
| WO | WO2006/062575 A2 | 6/2006 |

OTHER PUBLICATIONS

Jeon, N.L., et al., "Patterned Self-Assembled Monolayers Formed by Microcontact Printing Direct Selective Metalization by Chemical Vapor Deposition on Planar and Nonplanar Substrates", *Langmuir*, vol. 11, No. 8, 3024-3026 (1995).

Michel, B., et al., "Printing meets lithography: Soft approaches to high-resolution patterning", *IBM Journal of Research and Development*, vol. 45, No. 5, pp. 697-719 (2001), Sep. 5, 2001.

Pellerite, M. J., et al., "Effects of Fluorination on Self-Assembled Monolayer Formation from Alkanephosphonic Acids on Aluminum: Kinetics and Structure," *Journal of Physical Chemistry B*, 107, 11726-11736 (2003), web publ. Sep. 25, 2003.

Sard, R., "The Nucleation, Growth, and Structure of Electroless Copper Deposits", *Journal of the Electrochemical Society*, vol. 117, No. 7, pp. 864-870 (1970).

Ulman, A., "Formation and Structure of Self-Assembled Monolayers," *Chem. Rev.*, 96, 1533-1554 (1996).

V. Svorcik, et al., "Characterization of Evaporated and Sputtered Thin Au Layers on Poly-ethylene terephtalate)," Journal of Applied Polymer Science, 99 1698-1704 (2006).

U.S. Appl. No. 11/613,368, filed Dec. 20, 2008. Titled: Methods of Patterning a Deposit Metal on a Substrate.

Haneveld, et al., "Wet anisotropic etching for fluidic 1D nanochannels," Journal of Micromechanics and Microengineering, vol. 13, pp. 62-66, 2003, published online Jun. 13, 2003.

* cited by examiner

METHODS OF PATTERNING A MATERIAL ON POLYMERIC SUBSTRATES

BACKGROUND

The present disclosure relates generally to methods of patterning a material on a polymeric substrate and articles formed by such methods.

Polymeric films with patterns of metallic material have a wide variety of commercial applications. In some instances, it is desired that a conductive grid be sufficiently fine to be invisible to the unaided eye and supported on a transparent polymeric substrate. Transparent conductive sheets have a variety of uses including, for example, resistively heated windows, electromagnetic interference (EMI) shielding layers, static dissipating components, antennas, touch screens for computer displays, and surface electrodes for electrochromic windows, photovoltaic devices, electroluminescent devices, and liquid crystal displays.

The use of essentially transparent electrically conductive grids for such applications as EMI shielding is known. The grid can be formed from a network or screen of metal wires that are sandwiched or laminated between transparent sheets or embedded in substrates (U.S. Pat. Nos. 3,952,152; 4,179,797; 4,321,296; 4,381,421; 4,412,255). One disadvantage of using wire screens is the difficulty in handling very fine wires or in making and handling very fine wire screens. For example, a 20 micrometer diameter copper wire has a tensile strength of only 1 ounce (28 grams force) and is therefore easily damaged. Wire screens fabricated with wires of 20 micrometer diameter are available but are expensive due to the difficulty in handling very fine wire.

Rather than embed a preexisting wire screen into a substrate, a conductive pattern can be fabricated in-situ by first forming a pattern of grooves or channels in a substrate and then filling the grooves or channels with a conductive material. This method has been used for making conductive circuit lines and patterns by a variety of means, although usually for lines and patterns on a relatively coarse scale. The grooves can be formed in the substrate by molding, embossing, or by lithographic techniques. The grooves can then be filled with conductive inks or epoxies (U.S. Pat. No. 5,462,624), with evaporated, sputtered, or plated metal (U.S. Pat. Nos. 3,891,514; 4,510,347; and 5,595,943), with molten metal (U.S. Pat. No. 4,748,130), or with metal powder (U.S. Pat. Nos. 2,963,748; 3,075,280; 3,800,020; 4,614,837; 5,061,438; and 5,094,811). Conductive grids on polymer films have been made by printing conductive pastes (U.S. Pat. No. 5,399,879) or by photolithography and etching (U.S. Pat. No. 6,433,481). These prior art methods have limitations. For example, one problem with conductive inks or epoxies is that the electrical conductivity is dependent on the formation of contacts between adjacent conductive particles, and the overall conductivity is usually much less than that of solid metal. Vapor deposition of metal or electroplating is generally slow and often requires a subsequent step to remove excess metal that is deposited between the grooves. Molten metal can be placed in the grooves but usually requires the deposition of some material in the grooves that the metal will wet. Otherwise the molten metal will not penetrate nor stay in the grooves due to surface tension of the molten metal.

In addition to conductive grids, polymer films supporting patterns of conductive materials in the form of electrical circuits are also useful. Flexible circuitry is used in the support and interconnection of electronic components, as well as in the fabrication of sensors. Examples of sensors include environmental sensors, medical sensors, chemical sensors, and biometric sensors. Some sensors are preferably transparent. As in the case of conductive grids, flexible circuits on polymer film substrates are often fabricated using photolithography, which includes multiple steps of photoresist placement, exposure, development, and removal. Alternative methods that do not require such expensive equipment and so many fabrication process steps are desired in the industry.

Circuits have been made by placing metal powder into grooves followed by compacting the powder to enhance electrical contact between the particles. Lillie et al. (U.S. Pat. No. 5,061,438) and Kane et al. (U.S. Pat. No. 5,094,811) have used this method to form printed circuit boards. However, these methods are not practical for making fine circuits and fine metal patterns. On a fine scale, replacing or re-registering the tool over the embossed pattern to perform the metal compaction can be difficult. For example, a sheet with a pattern of 20 micrometer wide channels would require that the tool be placed over the pattern to an accuracy of roughly 3 micrometers from one side of the sheet to the other. For many applications, the sheet may be on the order of 30 cm by 30 cm. Dimensional changes due to thermal contraction of a thermoplastic sheet are typically about 1 percent or more during cooling from the forming temperature to room temperature. Thus, for a 30 cm by 30 cm sheet, a contraction of 1 percent would result in an overall shrinkage of 0.3 cm. This value is 1000 times larger than the 3 micrometer placement accuracy needed, making accurate repositioning of the tool difficult.

SUMMARY

The present disclosure relates to methods of patterning a material on a polymeric film substrate and articles comprising structured polymeric film substrates and patterned functionalizing materials. In particular, the present disclosure relates to methods of patterning a material on a polymeric substrate by selectively transferring a functionalizing material onto raised portions of a polymer film substrate with an essentially featureless printing plate and then etching the material from unfunctionalized regions (recessed regions or not raised regions). This new approach allows fine-scale patterns of functionalizing material and materials to be continuously transferred at high rates to web substrates with little regard for synchronization of a roll-to-roll apparatus.

In one exemplary implementation, a method includes providing a polymeric film substrate having a major surface with a relief pattern including a recessed region and an adjacent raised region, depositing a first material onto the major surface of the polymeric film substrate to form a coated polymeric film substrate, forming a layer of a functionalizing material selectively on the raised region of the coated polymeric film substrate to form a functionalized raised region and an unfunctionalized recessed region; and etching the first material from the polymeric substrate selectively from the unfunctionalized recessed region.

In another exemplary implementation, an article includes a polymeric film having: a major surface with a relief structure including, a raised region and an adjacent recessed region, the raised region selectively coated with a first material, and the first material supporting functionalizing molecules.

These and other aspects of the methods and articles according to the subject invention will become readily apparent to those of ordinary skill in the art from the following detailed description together with the drawings.

BRIEF DESCRIPTION OF THE DRAWINGS

The invention may be more completely understood in consideration of the following detailed description of various embodiments of the invention in connection with the accompanying drawings, in which.

Figure 1A:
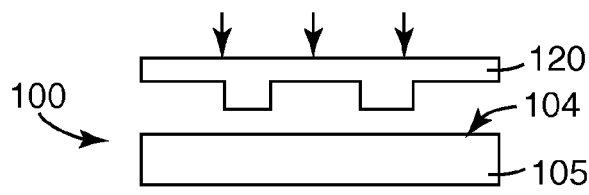
FIGS. 1A-1G is a schematic diagram of an illustrative method of patterning a material on a polymeric film substrate.
Figure 1B:
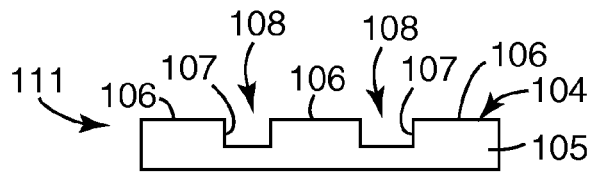
Figure 1C:
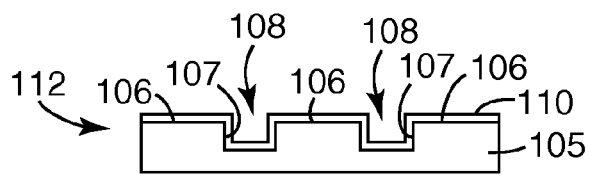
Figure 1D:
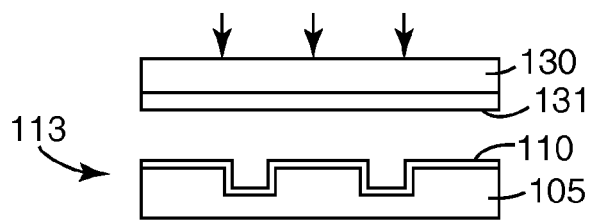
Figure 1E:
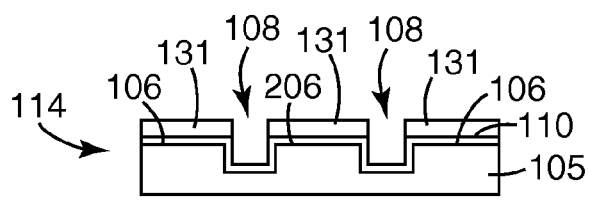
Figure 1F:
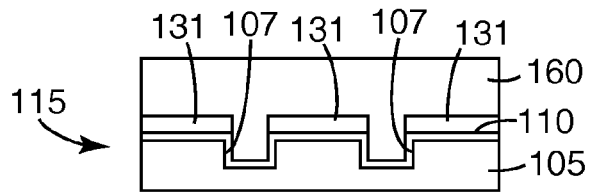
Figure 1G:
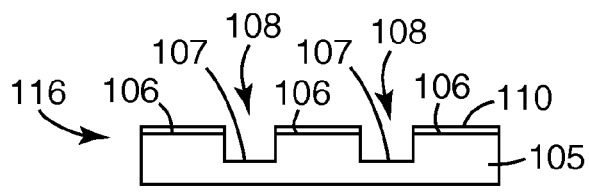
Figure 2A:
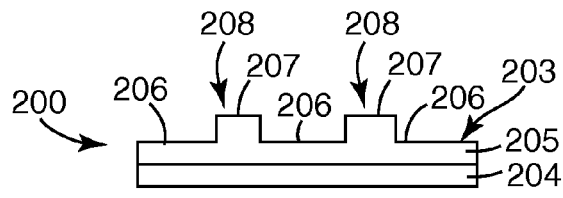
FIGS. 2A-2F is a schematic diagram of another illustrative method of patterning a material on a polymeric film substrate.
Figure 2B:
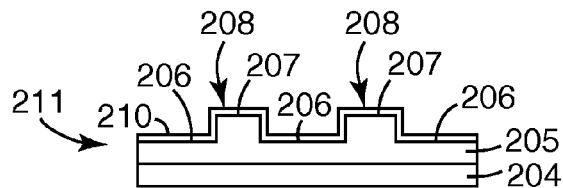
Figure 2C:
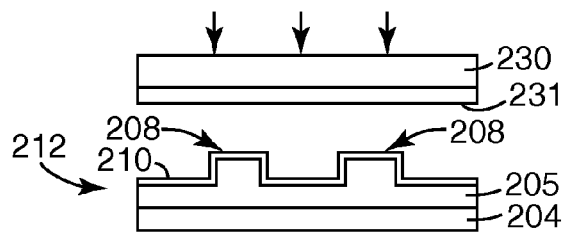
Figure 2D:
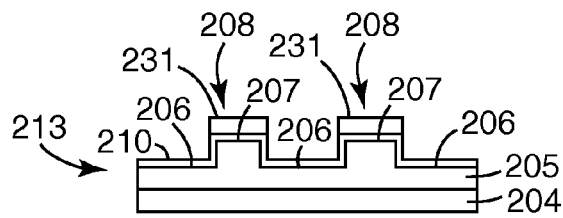
Figure 2E:
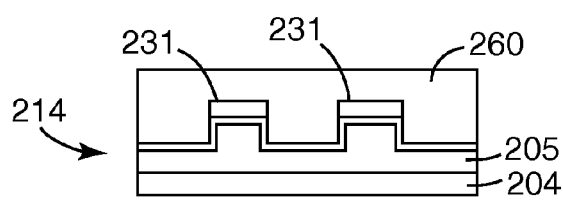
Figure 2F:
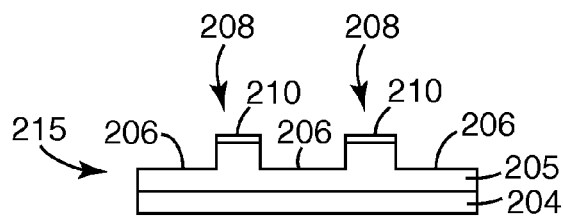

While the invention is amenable to various modifications and alternate forms, specifics thereof have been shown by way of example in the drawings and will be described in detail. It should be understood, however, that in intention is not to limit the invention to the particular embodiments described. On the contrary, the intention is to cover all modifications, equivalents, and alternatives falling within the spirit and scope of the invention.

DETAILED DESCRIPTION

Accordingly, the present disclosure is directed to methods of patterning a material on polymer film substrates. The polymer film substrates have a relief pattern (i.e., structure or microstructure) on one or both of their major surfaces. Polymer film substrates with a relief pattern on a major surface are said to be structured or micro structured.

By having a relief pattern, what is meant is that the surface includes a topographical pattern, for example a pattern of recessed regions (e.g., channels, wells, grooves) or a pattern of raised regions (e.g., ridges, posts, hemispheres). The polymer film substrates can be structured by cast-and-cure microreplication, or embossing, for example, and then these structured film substrates can have functionalizing molecules selectively placed on raised regions of the structured film substrate.

These functionalizing molecules can serve as a mask for subsequent patterning via, for example, selective etching. While the present invention is not so limited, an appreciation of various aspects of the invention will be gained through a discussion of the examples provided below.

For the following defined terms, these definitions shall be applied, unless a different definition is given in the claims or elsewhere in this specification.

"Region" refers to a contiguous fractional portion of an entire surface, e.g., of a substrate surface. A raised region refers to a surface region that projects away from adjacent regions of the major surface and has a height. A recessed region refers to a surface region that extends inward with respect to adjacent regions of a major surface and has a depth. A raised region and/or a recessed region can be a discrete region, where the adjacent recessed and/or raised region (respectively) surrounds the discrete region on all sides. Alternatively, the raised or recessed region can be a generally contiguous region that extends generally linearly along a length or width of the surface and adjacent regions of the major surface does not surround the contiguous region on all sides. A raised surface region of a substrate is in general that portion of a substrate surface that comes into contact with the flat surface of another object when the substrate surface and the flat surface (i.e., non-structured and planar) of the other object are made to touch, when the flat object is larger in area than the raised region and any adjacent recessed regions. The recessed surface region or regions of a substrate are in general the surface regions complementary to the raised surface regions, as just described. By complementary, what is meant is that all of the raised surface region or regions and all of the recessed surface region or regions combine to define essentially the entire major surface.

Forming a layer of functionalizing material "selectively," refers to forming a layer of functionalizing material on one surface region and not forming a layer of functionalizing on another surface region. For a layer of functionalizing material to be deposited selectively on a substrate surface, it is not deposited on the entire substrate surface. That is, the layer of functionalizing material forms a pattern on the substrate surface.

A polymeric "film" substrate is a polymer material in the form of a flat sheet that is sufficiently flexible and strong to be processed in a roll-to-roll fashion. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thickness, ranging in general from about 5 micrometers to 1000 micrometers. In many embodiments, polymeric film thicknesses range from about 25 micrometers to about 500 micrometers, or from about 50 micrometers to about 250 micrometers, or from about 75 micrometers to about 200 micrometers. For films that include a relief structure on one or both major surfaces, what is meant by thickness of the film is the average thickness across the area of the film.

Removing or etching a metal "selectively," refers to removing a material on one surface region and not removing the material on another surface region. For a material to be removed selectively on a substrate surface, it is not removed from the entire substrate surface.

A "functionalizing molecule" refers to molecules that attach to a substrate surface (or coated substrate surface) via a chemical bond. The functionalizing molecule can passivate or activate the surface region it is attached to. In many embodiments, the functionalizing molecules form a self-assembled monolayer.

A "self-assembled monolayer" refers to a single layer of molecules that are attached (e.g., by a chemical bond) to a surface and that have adopted a preferred orientation with respect to that surface and even with respect to each other. Self-assembled monolayers have been shown to cover surfaces so completely that the properties of that surface are changed. For example, application of a self-assembled monolayer can result in a surface energy reduction.

Examples of chemical species that are suitable for forming self-assembled monolayers include organic compounds such as organosulfur compounds, silanes, phosphonic acids, benzotriazoles, and carboxylic acids. Examples of such compounds are discussed in the review by Ulman (A. Ulman, "Formation and Structure of Self-Assembled Monolayers," *Chem. Rev.*, 96, 1533-1554 (1996)). In addition to organic compounds, certain organometallic compounds are useful for forming self-assembled monolayers. Examples of organosulfur compounds that are suitable for forming self-assembled monolayers include alkyl thiols, dialkyl disulfides, dialkyl sulfides, alkyl xanthates, and dialkylthiocarbamates. Examples of silanes that are suitable for forming self-assembled monolayers include organochlorosilanes and organoalkoxysilanes. Examples of phosphonic acid molecules that are suitable for forming self-assembled monolayers are discussed by Pellerite et al. (M. J. Pellerite, T. D. Dunbar, L. D. Boardman, and E. J. Wood, "Effects of Fluorination on Self-Assembled Monolayer Formation from Alkanephosphonic Acids on Aluminum: Kinetics and Structure," *Journal of Physical Chemistry B*, 107, 11726-11736 (2003)). Chemical species that are suitable for forming self-assembled monolayers can include, for example, hydrocarbon compounds, partially fluorinated hydrocarbon compounds, or perfluorinated compounds. The self-assembled monolayer can include two or more different chemical species. In the use of two or more different chemical species, the chemical species may exist in the self-assembled monolayer as a mixture or with a phase-separated morphology.

Illustrative useful molecules for forming a self-assembled monolayer include, for example, $(C_3-C_{20})$alkyl thiols, or $(C_{10}-C_{20})$alkyl thiols, or $(C_{15}-C_{20})$alkyl thiols. The alkyl groups can be linear or branched and can be substituted or unsubstituted with substituents that do not interfere with the formation of a self-assembled monolayer.

The self-assembled monolayer can be formed on an inorganic material-coated polymeric surface (e.g., a metal-coated polymeric surface) using a variety of methods. In many embodiments, the self-assembled monolayer is applied to the metal coated polymeric substrate raised regions by contacting the selected or raised regions with a plate having the self-assembled monolayer molecules disposed therein or thereon. By plate, what is meant is an elastomeric transfer element that delivers functionalizing molecules to the substrate. The plate may be planar, cylindrical, or other shape.

In many embodiments, the plate (or cylinder) having the self-assembled monolayer molecules disposed therein or thereon is featureless and the pattern of self-assembled monolayer on the polymeric substrate is defined by the raised or recessed regions of the polymeric substrate. By featureless, what is meant is that the plate is smooth (lacks a relief structure) on the scale of the relief structure on the substrate surface. As compared with prior art methods (e.g., microcontact printing, U.S. Pat. No. 5,512,131, incorporated herein by reference) the present disclsoure allows for the placement of functionalizing molecules (e.g., self-assembled monolayers) onto polymeric film surfaces in patterns without the need to limit slippage of the plate with respect to the substrate. In microcontact printing, the relief-structured stamp and the flat substrate must be contacted and separated without slippage in order to preserve pattern fidelity. This is especially challenging when attempting to continuously microcontact print very small feature sizes roll-to-roll on flexible polymeric film substrates. Roll-to-roll implementation of continuous microcontact printing with polymeric film substrates and small features sizes in the pattern (e.g., less than 10 micrometers, less than 1 micrometer) poses significant challenges in synchronization (e.g., control of web advance with respect to the printing plate rotation). The present disclosure overcomes the problem by allowing the pattern of transferred functionalizing molecules to be defined by the substrate relief structure, rather than the combination of printing plate relief and the details of contact and release from the substrate. Also, elastomeric materials are particularly useful for transferring functionalizing molecules (e.g., self-assembled monolayers) to surfaces, but have a tendency to deform under the printing action when structured with a fine-scale relief pattern. The present invention allows the pattern of functionalizing molecules on the polymer film substrate to be defined by a potentially more rigid material (substrate itself, rather than the elastomeric printing plate), further assuring ultimate pattern fidelity for the functionalizing molecules, and in turn the deposited metal.

Useful elastomers for forming the plate include silicones, polyurethanes, EPDM rubbers, as well as the range of existing commercially available flexographic printing plate materials (e.g., commercially available from E. I. du Pont de Nemours and Company, Wilmington, Del., under the trade name Cyrel®). Polydimethylsiloxane (PDMS) is particularly useful. The plate can be made from a composite material. The elastomer can be a gel material (e.g., co-continuous liquid and solid phases), for example a hydrogel. The plate can be supported on another material, for example a more rigid material for fixing the shape and size of the plate during use. The plate can be activated during transfer of the functionalizing molecules (e.g., heated, or ultrasonically driven).

Useful etching chemistries are dependent on the material being patterned and the functionalizing material. Criteria for selection of etching chemistry include satisfactory etch rate for the material being patterned, as well as compatibility with the functionalizing material. By compatibility, what is meant is that the patterned functionalizing material serves as an effective blocking mask for the patterned etching step. In the case of gold patterning, useful etch systems include those based on ferric nitrate and thiourea. Other useful etch systems for gold are based on potassium ferricyanide. Useful etch chemistries for patterning indium tin oxide include those based on oxalic acid. For etch-patterning copper, gold, or silver, alkaline solutions with dissolved oxygen and cyanide ion are useful, for example. It is contemplated herein to include additives to the etch bath to improve etch selectivity (U.S. Pat. No. 7,041,232, incorporated herein by reference).

An inorganic material coating (e.g., metallic coating) on the polymeric film substrate can be used to support the self-assembled monolayer, and in turn be patterned by etching. The inorganic coating can include, for example, elemental metal, metal alloys, intermetallic compounds, metal oxides, metal sulfides, metal carbides, metal nitrides, and combinations thereof. Exemplary inorganic surfaces for supporting self-assembled monolayers include gold, silver, palladium, platinum, rhodium, copper, nickel, iron, indium, tin, tantalum, as well as mixtures, alloys, and compounds of these elements. Useful compounds include metal oxides, for example indium tin oxide. The inorganic coatings on the polymeric substrate can be any thickness such as, for example, from 1 to 3000 nanometers. The inorganic material coating can be deposited using any convenient method, for example sputtering, evaporation, chemical vapor deposition, or chemical solution deposition (including electroless plating).

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The term "polymer" will be understood to include polymers, copolymers (e.g., polymers formed using two or more different monomers), oligomers and combinations thereof, as well as polymers, oligomers, or copolymers that can be formed in a miscible blend.

The disclosure generally relates to methods for patterning inorganic materials (e.g., metals) on polymeric film substrates having structured or microstructured surface. In many embodiments, the material remains on a substrate only in raised regions of the polymeric film substrate. These raised regions can exhibit a regular or repeating geometric arrangement on the polymeric film substrate, for example an array of polygons or a pattern of traces that define discrete areas that include an array of polygons. In other embodiments, the raised regions can exhibit a random arrangement on the polymeric film substrate, for example a random net of traces that define the boundaries of irregular shapes. In yet another embodiment, the raised regions can exhibit an arrangement that is not regular, repeating, or random, but that is a specified design which includes or lacks symmetry or repeating shapes. A material that is patterned can exist on only one region of the substrate surface or it may exist on more than one region of the substrate surface; but to be patterned it may not exist on all regions of the substrate surface.

Particularly advantageous approaches for the preparation of a relief pattern onto or into a polymeric film surface include replication or forming a microstructure with a mechanical tool. Mechanical tools form a microstructured or relief pattern onto and/or into the polymeric film surface by embossing, scribing, or molding the relief pattern or microstructure onto the polymeric film substrate surface. Replication includes the transfer of surface structural feature from a master tool (e.g., a mechanical tool) to another material and includes embossing or molding. Methods involving replication are noteworthy for the ease and speed with which materials with structured surfaces can be generated. Also noteworthy is the small size that can be achieved for surface structure features that are generated through replication. Nanoscale features with size less than 10 nanometers, can be replicated.

Replication can be achieved in any number of ways. One illustrative method for replicating the surface structural features of a master mechanical tool into the surface of another material is through thermal embossing (U.S. Pat. No. 5,932,150). Thermal embossing involves the pressing of a master mechanical tool against a deformable material, causing the surface structure of the master tool to deform the surface of the deformable material, thereby generating a negative replica of that master tool surface. Materials that can be embossed with surface structure include, for example, soft metals and organic materials such as polymers. Examples of soft metals that can be embossed include indium, silver, gold, and lead. Polymers suitable for thermal embossing include thermoplastics. Examples of thermoplastics include polyolefins, polyacrylates, polyamides, polyimides, polycarbonates, and polyesters. Further examples of thermoplastics include polyethylene, polypropylene, poly(methylmethacrylate), polycarbonate of bisphenol A, poly(vinyl chloride), poly(ethylene terephthalate), and poly(vinylidene fluoride). For the preparation of thermally embossed materials, it is often convenient and useful to start with material in film form. Optionally, a film for embossing can include multiple layers (U.S. Pat. No. 6,737,170 and U.S. Pat. No. 6,788,463).

Another approach for replicating the surface structure of a master mechanical tool into the surface of polymer is to cure a flowable precursor to the polymer while in contact with the master mechanical tool. Curing a flowable precursor to a polymer while in contact with the master mechanical tool is one form of molding. Examples of flowable precursors include neat monomers, mixtures of monomers, solutions of monomers or polymers that may include removable solvent, and uncrosslinked polymers. Generally, a precursor to the cured polymer can be cast onto a master mechanical tool or into a mold, followed by curing (U.S. Pat. No. 4,576,850). Curing refers to the development of increased elastic modulus, usually by way of a chemical reaction. Curing to develop elastic modulus can include heating, addition of a catalyst, addition of an initiator, or exposure to ultraviolet light, visible light, infrared light, X-rays, or an electron beam. Once the polymer has been cured, it can be removed as a solid from contact with the master tool or mold. Examples of polymers suitable for molding include polyacrylates, polyimides, epoxies, silicones, polyurethanes, and some polycarbonates. Polymers that are particularly useful for forming structured polymer films by molding and that suitable for roll-to-roll processing include polyacrylate and polymethacrylate. Some of these polymers also have optical properties that make them especially well-suited for certain display and sensor applications wherein they would support a patterned conductor (e.g., EMI shielding films), particularly polyacrylates.

Another illustrative method for generating a microstructure or a relief pattern on the surface of a polymeric film substrate includes using a mechanical tool is by scribing. "Scribing" refers to the application of a stylus to an otherwise unstructured surface and pressing or translating the stylus on the surface, generating surface microstructure. A stylus tip may be made of any material such as, for example, a metal, ceramic, or polymer. A stylus tip may include diamond, aluminum oxide, or tungsten carbide. A stylus tip may also include a coating, for example a wear-resistant coating such as titanium nitride.

The structured polymeric film substrate can be prepared from a suitable polymeric material that has sufficient mechanical properties (e.g., strength and flexibility) to be processed in a roll-to-roll apparatus. Examples of such polymers include thermoplastic polymers. Examples of useful thermoplastic polymers include polyolefins, polyacrylates, polyamides, polyimides, polycarbonates, polyesters, and biphenol- or naphthalene-based liquid crystal polymers. Further examples of useful thermoplastics include polyethylene, polypropylene, polystyrene, poly(methylmethacrylate), polycarbonate of bisphenol A, poly(vinyl chloride), polyethylene terephthalate, polyethylene naphthalate, and poly(vinylidene fluoride). Some of these polymers also have optical properties (e.g., transparency) that make them especially well-suited for certain display and sensor applications wherein they would support a patterned conductor (e.g., EMI shielding films), particularly polycarbonates and polyesters. Others of these polymers have thermal and electrical properties that make them especially well-suited for certain electrical circuit applications wherein they would support a patterned conductor (e.g., support and interconnection of electronic components), particularly polyimides and liquid crystal polymers.

FIGS. 1A-1G is a schematic diagram of an illustrative method of patterning a first material 110 on a polymeric film substrate 105. The polymeric substrate 105 is replicated 100 with a mechanical tool 120 to form a structured polymeric substrate 111 having a major surface 104 with a relief pattern including a recessed region 108 and an adjacent raised region 106. The mechanical tool 120 can be applied (as shown by the downward arrows) to a major surface 104 of the polymeric substrate 105. The mechanical tool 120 forms recessed regions 108 that extend into the major surface 104 of the polymeric substrate 105. The recessed regions 108 have a depth and a width defined by a recessed surface 107. In some embodiments, the recess regions 108 are generally parallel channels having a depth in a range from 0.1 to 10 micrometers and a width in a range from 0.25 to 50 micrometers, and a distance between adjacent parallel recess regions 108 is in a range from 100 micrometers to 1 centimeter.

The polymeric film substrate 105 can be formed of any useful polymeric material, as described above. In many embodiments, the polymeric substrate 105 is a flexible polymeric film that can be utilized in a roll-to-roll apparatus (shown in FIG. 3). In some embodiments, the polymeric substrate 105 is a flexible and optionally transparent polymeric film that can be utilized in a roll-to-roll apparatus (shown in FIG. 3).

A first material 110 is deposited on the major surface 104 including the raised regions 106 and recessed regions 108 of the polymeric substrate 105 to form a coated polymeric substrate 112. In many embodiments, the first material 110 is a metal layer, as described above.

A layer of functionalizing material 131 is selectively formed 113 on the raised region 106 to form a functionalized raised region 106 and unfunctionalized recessed region 108. The layer of functionalizing material 131 can be applied to the raised region 106 with a featureless plate 130 that can be elastomeric. The featureless plate 130 transfers the functionalizing material 131 to the raised region 106 where the featureless plate 130 contacts the raised region 106. The featureless plate 130 does not transfer the functionalizing material 131 to the recessed regions 108 since the featureless plate 130 does not contact the recessed surface 107. Thus, the relief pattern of the polymeric substrate 105 dictates the regions the functionalizing material 131 is selectively transferred to. In many embodiments, the functionalizing material is a self-assembled monolayer 131, as described above.

The selectively functionalized polymeric substrate 114 is then exposed 115 to an liquid etchant solution 160 that selectively etches the material 110 from the unfunctionalized recess regions 108, forming the first material patterned polymeric substrate 116. In one embodiment, the first material 110 includes gold. In many embodiments, at least a portion of the layer of functionalizing material 131 can be removed after the selective etch step.

FIG. 2A-2F is a schematic diagram of another illustrative method of patterning a material 210 on a polymeric film substrate 200. The illustrated polymeric substrate 200 includes two or more polymeric layers where the first polymeric layer 204 is a base layer and a second layer 205 is disposed on the first layer 204. The first polymeric layer 204 and the second polymeric layer 205 can be formed from the same or different polymer material. In some embodiments, the first polymeric layer 204 is formed from a polyester such as polyethylene terepthalate or polyethylene napthalate, and the second polymeric layer 205 is formed from a polyacrylate. In many embodiments, the first polymeric layer 204 and the second polymeric layer 205 form a film or web. In many embodiments, the polymeric substrate 200 is a flexible and optionally transparent polymeric film that can be utilized in a roll-to-roll apparatus (shown in FIG. 3).

The polymeric substrate 200 has a major surface 203 with a relief pattern including one or more raised regions 208 that project from the major surface 203 and one or more recessed regions 206 are adjacent to the raised regions 208. The raised regions 208 can be formed by any of the replication methods described herein. The raised regions 208 are defined by raised region surfaces 207. The raised regions 208 have a height and a width defined by a raised region surface 207. In some embodiments, the raised regions 208 are generally parallel ridges having a height in a range from 0.1 to 10 micrometers and a width in a range from 0.25 micrometers to 2 millimeters, and a distance between adjacent parallel raised regions 208 is in a range from 0.25 micrometers to 1 centimeter.

A first material 210 is deposited on the recessed regions 206 and raised regions 208 to form a coated polymeric film substrate 211. In many embodiments, the first material 210 is a metal layer, as described above.

A layer of functionalizing material 231 is selectively formed 212 on the raised regions 208 to form a functionalized raised region surface 207 and an unfunctionalized recessed region 206. The layer of functionalizing material 231 can be applied to the raised regions 208 with a featureless plate 230 that can be elastomeric. The featureless plate 230 transfers the functionalizing material 231 to the raised regions 208 where the featureless plate 230 contacts the raised regions 208. The featureless plate 230 does not transfer the functionalizing material 231 to the recessed regions 206 since the featureless plate 230 does not contact the recessed region 206. Thus, the relief structure of the polymeric film substrate dictates the regions the functionalizing material 231 is selectively transferred to. In many embodiments, the functionalizing material is a self-assembled monolayer 231, as described above.

The selectively functionalized polymeric substrate 213 is then exposed 214 to liquid etchant solution 260 that selectively etches the material 210 from the unfunctionalized recess region 106, forming the first material patterned polymeric substrate 215. In one embodiment, the first material 110 includes gold. In many embodiments, at least a portion of the layer of functionalizing material 231 can be removed after the selective etch step.

Figure 3:
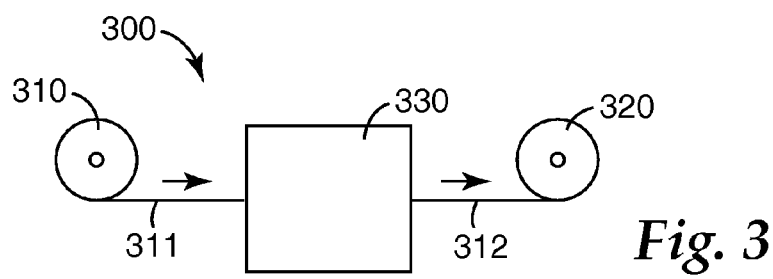
FIG. 3 is a schematic diagram of an illustrative roll-to-roll apparatus.

FIG. 3 is a schematic diagram of an illustrative roll-to-roll apparatus 300. The illustrated roll-to-roll apparatus 300 includes an input roll 310 and a take-up roll 320 and a polymeric film 311. The method illustrated in FIG. 1 and FIG. 2 can be carried out at box 330 on the polymeric film 311. The patterned polymeric substrate or film 312 can be wound onto the take-up roll, as shown, further processed, as desired.

The patterned first material on the polymeric substrate may be described as having an area shape and an area size on the substrate surface, as well as a thickness. The area shape of the patterned first material can exhibit a regular or repeating geometric arrangement on the substrate, for example an array of patterned first material polygons or a pattern of patterned first material traces that define the boundaries of discrete etched areas that include an array of polygons. In other embodiments, the patterned first material shapes may exhibit a random arrangement on the substrate, for example a random net of traces that define the boundaries of irregular shapes for etched areas. In yet another embodiment, the patterned first material shapes may exhibit an arrangement that is not regular, repeating, or random, but that is a specified design which includes or lacks symmetry or repeating geometric elements. In one embodiment, a shape for the patterned first material that is useful for making a light-transmitting, EMI shielding material is a square grid, which includes traces of the patterned first material characterized by a width, thickness, and pitch. Other useful shapes for making a light-transmitting, EMI shielding material include continuous metallic traces that define open areas that have the shape of a regular hexagon and that are arranged in closely packed order. In order to fabricate continuous metal traces in the form a square grid, useful relief patterns for the polymeric film substrate include a square array of recessed square regions (oriented parallel to the grid). In order to fabricate continuous metal traces in the form of a hexagonal net, useful relief patterns for the polymeric film substrate include a hexagonal array of recessed hexagonal regions (with edges oriented parallel to the net trace directions). In summary, for fabricating EMI shielding patterns of deposited conductor, some useful relief patterns comprise an array of discrete recessed regions each surrounded by a contiguous raised region.

In order to fabricate metallic wire grid polarizer structures (e.g., for visible light), a relief pattern including an array of parallel ridges is useful, with width and spacing less than the wavelength of light desired to be polarized, or less than one third the wavelength of the light desired to be polarized, or less than one tenth the wavelength of the light to be polarized. In many embodiments, the heights for the ridges range from one fourth of the width to ten times the width.

In some embodiments, the smallest area dimension for the patterned first material shapes, for example the width of a linear trace of patterned first material, can range from 100 nanometers to 1 millimeter, or from 500 nanometers to 50 micrometers, or from 1 micrometer to 25 micrometers, or from 1 micrometer to 15 micrometers, or from 0.5 to 10 micrometers. In one illustrative embodiment for making a light-transmitting EMI shielding material, the width of linear traces of patterned first material is in a range from 5 micrometers to 15 micrometers, or from 0.5 to 10 micrometers; the thickness is in a range from 0.5 to 10 micrometers, or from 1 micrometer to 5 micrometers; and the pitch is in the range from 25 micrometers to 1 millimeter, or from 100 to 500 micrometers. The largest area dimension for the patterned first material shapes above, for example the length of a linear trace of patterned first material, can range from 1 micrometer to 5 meters, or from 10 micrometers to 1 meter. For making a light-transmitting EMI shielding material, a sheet of EMI shielding material, the length of linear traces of patterned first material can be in the range from 1 centimeter to 1 meter, for example.

The present invention should not be considered limited to the particular examples described herein, but rather should be understood to cover all aspects of the invention as fairly set out in the attached claims. Various modifications, equivalent processes, as well as numerous structures to which the present invention can be applicable will be readily apparent to those of skill in the art to which the present invention is directed upon review of the instant specification.

EXAMPLES

Unless otherwise noted, chemical reagents and solvents were or can be obtained from Aldrich Chemical Co., Milwaukee, Wis.

Example 1

Substrate Preparation

A 250 micrometer thick film of transparent polycarbonate (available under the trade name Lexan from GE Plastics division (Pittsfield, Mass.) of General Electric Company (Fairfield, Conn.)) was thermally embossed with a relief pattern of recessed gridlines complemented by raised squares. The embossing tool was fabricated from a round 10 centimeter diameter plate of fused quartz using photolithography and reactive ion etching methods. The tool included 10 micrometer wide ridges that were approximately 10 micrometers high and that defined the lines of a square grid with a pitch of 200 micrometers. Embossing was carried out by pressing, with 10,000 newtons of force, the embossing tool against the polycarbonate film at 176° C. for 15 minutes using a Model AUTO M laminating press (available from Carver, Inc., Wabash, Ind.). The embossed film included 10 micrometer wide channels that were approximately 10 micrometers deep and that defined the lines of a square grid with a pitch of 200 micrometers. Once embossed, the polycarbonate film was first metallized by evaporation of a 15 angstroms titanium layer to form a tie layer followed by a 600 angstroms gold layer using a thermal evaporator (available from from Kurt J. Lesker Co., Pittsburgh, Pa.).

Elastomer Plate Preparation

Two essentially featureless plates of polydimethylsiloxane (PDMS, Sylgard® 184 from Dow Corning Corporation of Midland, Mich.) were cast against a single crystal of silicon. One plate was partially submerged in a 5 millimolar solution of octadecanethiol in ethanol for two days with cast-flat side exposed to air, in order to saturate the plate. The second plate was then placed by hand in contact with and on top of the first plate for 30 minutes to create an inked surface of the second plate.

The metallized, structured surface of the polycarbonate film was then placed by hand in contact with the inked surface of second plate to transfer a self-assembled monolayer (SAM) of octadecanethiol to the raised regions of the polycarbonate film, leaving the 10 micrometer wide recesses (or channels) unfunctionalized (without SAM).

Etching

The SAM printed substrate (having unfunctionalized 10 micrometer wide recesses, can then be submerged in a liquid etchant for 15 minutes to remove gold from the recessed regions of the structured substrate. The liquid etchant for gold can be, for example, an aqueous solution of ferric nitrate at 0.02 molar concentration and thiourea at 0.03 molar concentration.

The resulting substrate would be a flexible, structured substrate with gold on its major surface in a form of a pattern, the geometry of the pattern defined by the gold free recessed regions of the structured substrate.

We claim:

1. A method of patterning a first material on a polymeric substrate comprising:
    providing a transparent polymeric film substrate having a major surface with a relief pattern comprising a recessed region and an adjacent raised region, wherein the recessed region has a floor and sidewalls;
    depositing a first material onto the major surface of the polymeric film substrate to form a coated polymeric film substrate, wherein the depositing a first material comprises depositing a metal onto the polymeric film substrate;
    forming a layer of a functionalizing material selectively on the raised region of the coated polymeric film substrate to form a functionalized raised region and an unfunctionalized recessed region, wherein the functionalizing material is a self-assembled monolayer selectively onto the raised region and the self-assembled monolayer comprises a chemical species selected from the group consisting of organosulfur compounds, silanes, phosphonic acids, benzotriazoles, and carboxylic acids, wherein forming comprises unwinding the coated polymeric film substrate from a support and winding the coated polymeric film substrate onto a support; and
    etching the first material from the polymeric substrate selectively from the floor and sidewalls of the unfunctionalized recessed region, forming a first material patterned polymeric substrate.

2. A method according to claim 1 further comprising forming the major surface with a relief pattern by molding or embossing the polymeric film substrate with a mechanical tool.

3. A method according to claim 1 wherein the providing step comprises providing a polymeric film substrate comprising a polymer selected from the group of polyolefins, polyamides, polyimides, polycarbonates, polyesters, polyacrylates, polymethacrylates, and liquid crystal polymers.

4. A method according to claim 1 further comprising removing the functionalizing material from the raised region after the etching step.

5. A method according to claim 1 wherein the forming step comprises applying the functionalizing material selectively onto the raised region of the coated polymeric film substrate, with an elastomeric plate.

6. A method according to claim 1 wherein the forming step comprises applying the functionalizing material selectively onto the raised region of the coated polymeric film substrate, with a featureless elastomeric plate.

7. A method according to claim 1 wherein the depositing a metal comprises depositing 10 angstroms to 30000 angstroms of a metal selected from the group consisting of gold, silver, palladium, platinum, rhodium, copper, nickel, iron, indium, tin, and mixtures, alloys, and compounds thereof.

8. A method according to claim 1 wherein the providing step comprises providing a polymeric film substrate having a major surface with a relief pattern comprising an array of discrete recessed regions each surrounded by a contiguous raised region.

9. A method according to claim 1 wherein the providing step comprises providing a polymeric film substrate having a major surface with a relief pattern comprising a plurality of raised regions in the form of linear traces that are isolated from each other by a contiguous recessed region.

10. A method according to claim 9 wherein the providing step comprises providing a polymeric film substrate having a major surface with a relief pattern comprising a plurality of raised regions in the form of linear traces that are isolated from each other by a contiguous recessed region, the raised regions having a height in a range from 0.1 micrometer to 10 micrometers and a width in a range from 0.25 micrometer to 2 millimeters.

11. A method according to claim 9 wherein the providing step comprises providing a polymeric film substrate having a major surface with a relief pattern comprising a plurality of raised regions in the form of linear traces that are generally parallel with a distance between adjacent generally parallel raised regions in a range from 0.25 micrometer to 1 centimeter.

* * * * *

UNITED STATES PATENT AND TRADEMARK OFFICE
CERTIFICATE OF CORRECTION

PATENT NO. : 8,764,996 B2
APPLICATION NO. : 11/550542
DATED : July 1, 2014
INVENTOR(S) : Matthew Frey et al.

It is certified that error appears in the above-identified patent and that said Letters Patent is hereby corrected as shown below:

On title page 2
Column 2, (line 18) under "Other Publications," delete "Poly-ethylene" and insert -- Polyethylene --, therefor.

Column 2, (line 20) under "Other Publications," delete "Dec. 20, 2008." and insert -- Dec. 20, 2006. --, therefor.

In the Specification

Column 3,
Line 25, delete "micro structured." and insert -- microstructured. --, therefor.

Signed and Sealed this
Twenty-first Day of October, 2014

Michelle K. Lee
*Deputy Director of the United States Patent and Trademark Office*